(12) United States Patent
Hasegawa et al.

(10) Patent No.: US 7,828,341 B2
(45) Date of Patent: Nov. 9, 2010

(54) STORAGE CONTAINER

(75) Inventors: Akihiro Hasegawa, Itoigawa (JP); Hiroshi Mimura, Kawagoe (JP)

(73) Assignee: Shin-Etsu Polymer Co., Ltd., Chuo-ku, Tokyo (JP)

( * ) Notice: Subject to any disclaimer, the term of this patent is extended or adjusted under 35 U.S.C. 154(b) by 525 days.

(21) Appl. No.: 11/817,574

(22) PCT Filed: Mar. 30, 2006

(86) PCT No.: PCT/JP2006/306661

§ 371 (c)(1),
(2), (4) Date: Aug. 31, 2007

(87) PCT Pub. No.: WO2006/114981

PCT Pub. Date: Nov. 2, 2006

(65) Prior Publication Data
US 2009/0026109 A1 Jan. 29, 2009

(30) Foreign Application Priority Data
Apr. 18, 2005 (JP) ............................. 2005-119751

(51) Int. Cl.
*B65D 85/00* (2006.01)
(52) U.S. Cl. ............................. 292/44; 70/116; 70/120; 70/131; 292/49; 292/304; 292/DIG. 11; 206/711; 206/1.5
(58) Field of Classification Search ................. 206/710, 206/711, 454, 832; 292/44, 45, 49, 50, 54, 292/197, 202, 210, 310; 70/116, 120, 131
See application file for complete search history.

(56) References Cited

U.S. PATENT DOCUMENTS 4,893,849 A * 1/1990 Schlack .......................... 292/7

(Continued)

FOREIGN PATENT DOCUMENTS

JP 4-505234 A 9/1992

(Continued)

OTHER PUBLICATIONS

Form PCT/ISA/210 (International Search Report) dated Jun. 20, 2006.

*Primary Examiner*—J. Gregory Pickett
*Assistant Examiner*—Rishi Verma
(74) *Attorney, Agent, or Firm*—Buchanan, Ingersoll & Rooney PC

(57) ABSTRACT

To provide a storage container which can inhibit and prevent generation of dust due to the motions of an advancing and retracting element, whose door element can be formed with a reduced space and thickness and which can prevent contamination of the articles accommodated therein, the storage container includes a container body 1 for storing precision substrates, a door element 10 that opens and closes the front of container body 1 and a locking mechanism 20 for locking and unlocking door element 10 that covers container body 1. Locking mechanism 20 is constructed of a rotary plate 21 that is supported by door element 10, a first advancing and retracting plate 26 that, in accordance with the rotation of rotary plate 21, advances toward the peripheral wall of door element 10 when door element 10 is locked and retracts to the reference position inside door element 10 when door element 10 is unlocked; a second advancing and retracting plate 32 which is supported by the front end part of first advancing and retracting plate 26, and projects out from the peripheral wall of door element 10 and fits into an engaging recess 3 of container body 1 when door element 10 is locked and returns from engaging recess 3 of container body 1 toward the door element when door element 10 is unlocked; a guide rib 37 which makes the second advancing and retracting plate 32 incline in the thickness direction of the door element 10 as the plate is being projected.

8 Claims, 10 Drawing Sheets

U.S. PATENT DOCUMENTS

| | | |
|---|---|---|
| 4,995,430 A | 2/1991 | Bonora et al. |
| 5,931,512 A | 8/1999 | Fan et al. |
| 5,957,292 A * | 9/1999 | Mikkelsen et al. .......... 206/710 |
| 6,000,732 A * | 12/1999 | Scheler et al. ................ 292/68 |
| 6,105,782 A * | 8/2000 | Fujimori et al. ............. 206/710 |
| 2002/0106266 A1 | 8/2002 | Bonora et al. |
| 2002/0134784 A1 | 9/2002 | Hsieh et al. |
| 2004/0040884 A1 | 3/2004 | Pai et al. |
| 2004/0232036 A1 | 11/2004 | Matsutori et al. |
| 2005/0161367 A1 | 7/2005 | Matsutori et al. |

FOREIGN PATENT DOCUMENTS

| | | |
|---|---|---|
| JP | 2000-058633 A | 2/2000 |
| JP | 2001-512288 A | 8/2001 |
| JP | 2003-133405 A | 5/2003 |
| JP | 2003-174080 A | 6/2003 |
| JP | 2004-525502 A | 8/2004 |
| JP | 2005-101518 A | 4/2005 |
| WO | WO 90/14273 A1 | 11/1990 |
| WO | WO 93/18543 A2 | 9/1993 |
| WO | WO 01/04022 A1 | 1/2001 |
| WO | WO 02/49079 A2 | 6/2002 |

* cited by examiner

STORAGE CONTAINER

TECHNICAL FIELD

The present invention relates to a storage container for storing substrates and the like, represented by semiconductor wafers, photomask glass substrates and aluminum disks.

BACKGROUND ART

Precision substrates of semiconductor wafers having a diameter of 300 mm are stored in a front open box type storage container. A storage container of this kind is comprised of a front open box type container body that stores a plurality of unillustrated precision substrates in alignment, a door element for detachably closing the open front of the container body in a sealing manner and a locking mechanism for locking and unlocking the door element fitted at the front of the container body, and is configured so as to be standardized conforming to SEMI E47.1. The door element is automatically opened and closed by a door opening/closing device of processing equipment having a standardized mechanical interface.

The locking mechanism includes: a rotary plate that is supported by the door element and rotated by the door opening/closing device of the processing equipment; a pair of advancing and retracting plates that linearly advance and retract toward the peripheral wall of the door element as this rotary plate rotates; and engagement pieces, which are provided at the front ends of the advancing and retracting plates and project from the peripheral wall of the door element and fit into recesses on the inner periphery of the front of the container body when the door element is locked and retract from the recesses of the container body into the door element when the door element is unlocked.

In the above, when the open front of the container body is confined by the door element, the door opening/closing device of processing equipment tightly presses and fits the door element to the open front of the container body, then, the door opening/closing device causes the rotary plate of the locking mechanism to rotate from without so as to advance each advancing and retracting plate from the interior of the door element toward the peripheral wall. With this advancement of each advancing and retracting plate, each engagement piece projects out of the peripheral wall and fits into the recess of the container body, thereby enclosing the front of the container body with the door element in a sealed state.

In a case where the advancing and retracting plate of the locking mechanism and its engagement piece are formed of an integrated single part, as the advancing and retracting plate makes simple linear motions, there is a fear that the advancing and retracting plate and its engagement piece may abrade the recess of the container body to produce particulates. To eliminate this problem, there has been a proposal (see patent document 1) in which the front end part of the advancing and retracting plate is greatly inclined at an acute angle toward the thickness direction (width direction) of the door element) after the plate has been advanced. There is also another proposal (see patent document 2) in which the advancing and retracting plate is formed of a plurality of parts and a separate engagement metal shaft is rotatably supported at the front end part of the advancing and retracting plate.

Patent document 1:
    Japanese Patent Application Disclosure Hei-04 No. 505234

Patent document 2:
    Japanese Patent Application Laid-open No. 2000-58633.

DISCLOSURE OF INVENTION

Problems to be Solved by the Invention

In the conventional storage containers, generation of particulates due to simple linear motions of the advancing and retracting plate is attempted to be resolved by the technologies as described above, but either method is problematic. First, when the front end part is greatly inclined at an acute angle after the advancing and retracting plate has been advanced, there occurs a new serious problem in that the front end of the advancing and retracting plate has to be formed so as not to be broken if a strong force is applied in order to transfer a high enough engaging force to the front end part of the advancing and retracting plate.

There also occurs another new problem in that in order to incline the front end part of the advancing and retracting plate at an acute angle, the space and thickness of the door element should be made greater. Further, the rotary plate of the locking mechanism has to be formed with specially-shaped plural steps of cam facets, resulting in a complex configuration.

On the other hand, when the advancing and retracting plate is formed of a plurality of parts and a separate engagement shaft is rotatably supported at the front end part of each advancing and retracting plate, there is more than a small concern that contact of the metal engagement shaft causes contamination of the precision substrates.

The present invention has been devised in view of the above, it is therefore an object of the present invention to provide a storage container which can inhibit and prevent generation of dust due to the motions of the advancing and retracting plates, whose door element can be formed with a reduced space and thickness and which can prevent contamination of the articles accommodated therein.

Means for Solving the Problems

In order to solve the above problems, the present invention provides a storage container comprising: a container body for accommodating articles; a door element for opening and closing the opening of the container body; and a locking mechanism for locking the door element that covers the opening of the container body, characterized in that the locking mechanism includes: a rotatable rotatory element; a first advancing and retracting element which, in accordance with the rotation of the rotatory element, projects toward the door element's periphery from a door element's reference position when the door element is locked and returns to the door element's reference position when the door element is unlocked; a second advancing and retracting element which is rotatably supported by the first advancing and retracting element, and projects out from the door element to be inserted into a recess in the inner periphery of the opening of the container body when the door element is locked and returns from the recess of the container body towards the door element when the door element is unlocked; and a guide element for inclining the second advancing and retracting element in the door element's direction of thickness when it is projecting.

In the above, it is possible that the door element is formed of a casing to be fitted to the opening of the container body and a cover that covers the casing, the rotary element of the locking mechanism, first advancing and retracting element and second advancing and retracting element are laid out between the casing and the cover, and the guide element of the locking mechanism is formed at least on one of the opposing surfaces of the casing and the cover.

It is also possible that pin projections that come into contact with the guide element are formed at both lateral sides of the second advancing and retracting element in the locking mechanism, the guide element is formed to have an approximately polygonal section, and the contact surface of the guide element that abuts the pin projections of the second advancing and retracting element is inclined so that the second advancing and retracting element that is projecting is inclined at an angle ranging from 10 to 45 degrees with respect to the first advancing and retracting element.

Further, it is also possible that the second advancing and retracting element in the locking mechanism is formed as an approximately flat plate, and the front end part of the second advancing and retracting element is formed in a shape that reduces the area of contact with the recess of the container body.

Here, the articles defined in the scope of the claims may at least include a single or plurality of substrates represented by semiconductor wafers (200, 300, 450 mm types etc.), photomask glass, liquid crystal glass and aluminum disks, mechanical parts, electric and electronic parts, construction articles, domestic articles and the like. The container body and storage container may be either a front open box type or top open box type, and is not particularly limited to being either transparent, opaque or translucent, either conductive or insulative and either being a FOUP type or FOSB type. A see-through window for checking the articles can be optionally formed in part of the ceiling or wall of the container body. A single or plurality of locking mechanisms may be provided.

The first advancing and retracting element in the locking mechanism may be a type that moves vertically, or may be a type that moves back and forth or a type that moves left and right. The second advancing and retracting element is rotatably supported by the first advancing and retracting element; this term "rotate" includes "pivot" and "swing". The front end part of this second advancing and retracting element is formed in a shape that reduces the area of contact with the recess of the container body; specifically, it is formed in a shape having an approximately triangular section, in a wedge shape, in an arrow shape or the like. Further, the pin projection may be a type that directly touches the guide element or may be a type that indirectly touches the guide by way of a cylindrical roller.

According to the present invention, when the door element is fitted to the opening of the container body and then the rotary element of the locking mechanism is rotated, the first advancing and retracting element projects toward the periphery of the door element as the rotary element turns. With this projection of the first advancing and retracting element, the separate second advancing and retracting element, as it is being guided by the guide element, projects obliquely from the door element, and comes into contact with the recess of container body in an inclined manner. By this contact, the container body is confined by the door element.

EFFECT OF THE INVENTION

The present invention makes it possible to inhibit and prevent generation of dust due to motion of the advancing and retracting element, and also provides an effect of reducing the space and thickness of the door element. Further, since it is possible to reduce metallic parts or omit them, this provides the effect of preventing the articles to be stored from being contaminated.

Further, the rotary element, first advancing and retracting element and second advancing and retracting element are disposed between the casing and cover of the door element, so that the locking mechanism can be protected by the cover's protecting function from being damaged or deformed due to external force acting on the locking mechanism.

Further, when the contact surface of the guide element that abuts the pin projections of the second advancing and retracting element is inclined so that the second advancing and retracting element is inclined at an angle ranging from 10 to 45 degrees with respect to the first advancing and retracting element, it is possible to inhibit the front end part of the second advancing and retracting element from scuffing the recess of the container body or the motion of the second advancing and retracting element from being hindered.

Moreover, when the second advancing and retracting element in the locking mechanism is formed as an approximately flat plate, and the front end part of this second advancing and retracting element is formed in a shape that reduces the area of contact with the recess of the container body, it is possible to prevent generation of particulates, dust and the like due to abrasion of the second advancing and retracting element against the recess of the container body.

Figure 1:
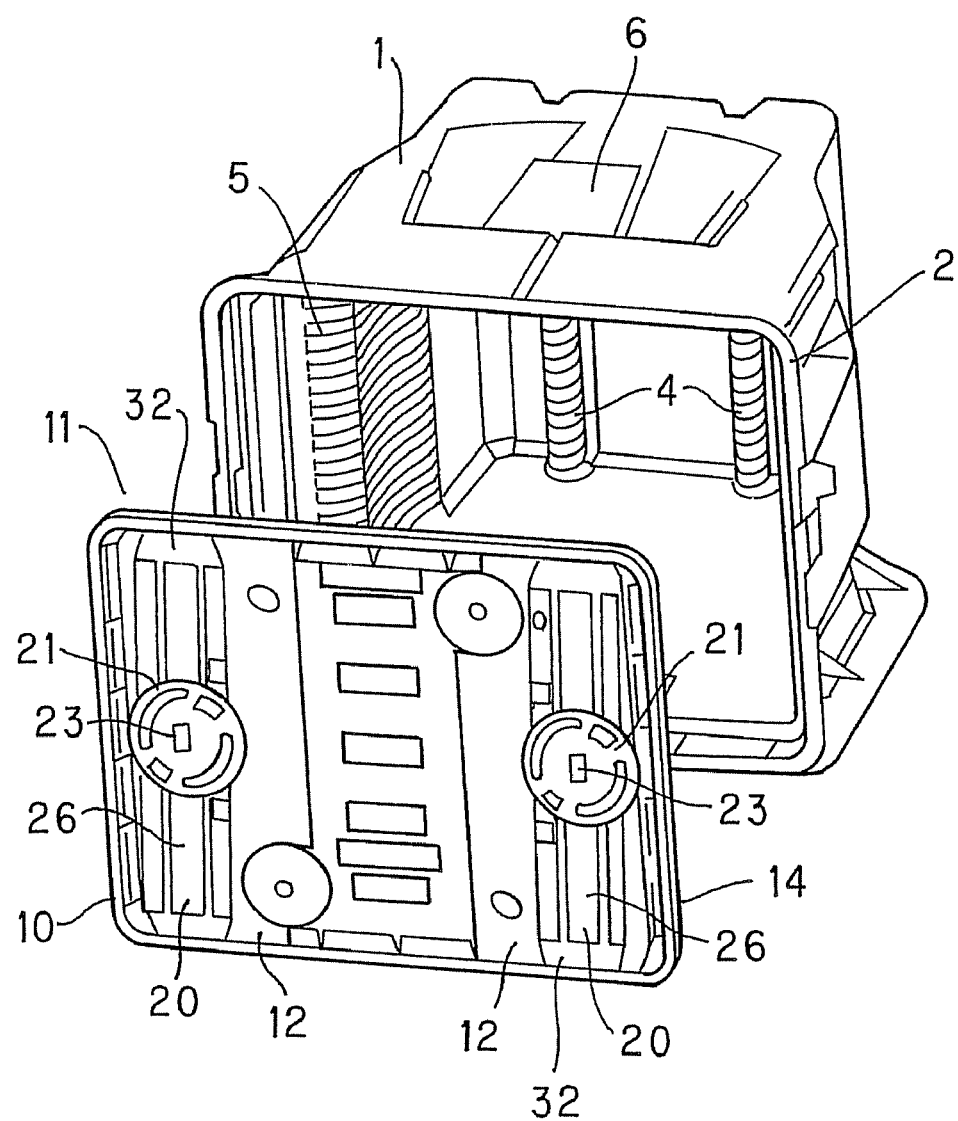
FIG. 1 is an overall perspective view showing an embodiment mode of a storage container according to the present invention.

DESCRIPTION OF REFERENCE NUMERALS 1 container body
2 rim portion (opening)
3 engaging recess (recess)
10 door element
11 casing
12 cover
13 guide
15 through-hole
20 locking mechanism
21 rotary plate (rotary element)
26 first advancing and retracting plate (first advancing and retracting element)
31 pin projection
32 second advancing and retracting plate (second advancing and retracting element)
34 engaging projection (front end part)
35 grooved portion
36 pin projection
37 guide rib (guide element)

BEST MODE FOR CARRYING OUT THE INVENTION

Referring to the drawings, a preferred embodiment of the present invention will be described hereinbelow. As shown in FIGS. 1 through 12, a storage container of the present embodiment is a precision substrate storage container for transportation which is comprised of a container body 1 for accommodating a plurality of precision substrates as articles, a door element 10 for opening and closing the open front of this container body 1, a pair of left and right locking mechanisms 20 for locking and unlocking door element 10 that encloses the front of container body 1, and each locking mechanism 20 is formed of a rotary plate 21, a pair of first advancing and retracting plates 26 and a pair of second advancing and retracting plates 32 and a plurality of guide ribs 37.

Though not shown, the precision substrate is a thin circular disk-shaped semiconductor wafer having a diameter of 300 mm with, of the obverse and reverse sides, at least its obverse mirror-finished, and 25 or 26 pieces of the substrates are put into and taken out of container body 1 by a dedicated robot.

As shown in FIG. 1, container body 1 is formed of a predetermined resin into a transparent front-open box having a front opening and functions to accommodate a plurality of precision substrates in alignment from top to bottom. The predetermined resin that forms this container body 1 is not particularly limited, but examples may include polycarbonate, polyether imide, polyether sulfone, polyether etherketone, cyclo-olefin and the like. Of these, polycarbonate is most preferable because it is excellent in rigidity and transparency. These resins are imparted with electric conductivity as necessary.

In container body 1, the peripheral part of its front is bent outwards in an approximately L-shape when sectionally viewed, forming a rim portion 2 for receiving the door element. Hollowed and formed on either side at top and bottom on the inner peripheral surface of this rim portion 2 are engaging recesses 3 for locking mechanisms 20 (see FIGS. 4, 5 and 8). Pairs of left and right rear retainers 4 are formed in parallel at intervals from top to bottom to hold precision substrates at their rear peripheries by means of retaining grooves. A pair of left and right teeth 5 for approximately horizontally holding a precision substrate at its periphery on both sides are formed opposing each other on both sides of the interior of container body 1, pairs of these teeth 5 being arranged at intervals from top to bottom.

Each tooth 5 is comprised of a flat plate formed in an approximately widely open-V-shape or an approximately semi-circular arc shape, when viewed in plan, so as to go along the side periphery of the precision substrate, a flat, front medium thickness area formed integrally in the front and interior part of the flat plate, a flat, front thick area formed integrally on the front outer side of the flat plate and located outside the front medium thickness area, a rear medium thickness area formed integrally in the rear part of the flat plate, and a small rear thick area formed in the rear part of the flat plate and in front of the rear medium thickness area and located close to the side wall of container body 1.

A vertical step that will come into contact with the side periphery of the precision substrate is somewhat formed between the front medium thickness area and the front thick area of tooth 5, so that the front thick area functions to stop substrates tipping forwards out of container body 1 when door element 10 is removed. Also, a thin thickness area that is slightly indented is formed between the front medium thickness area and the rear medium thickness area, and this thin thickness area opposes the side periphery of the precision substrate, forming a very narrow gap therebetween. In this way, teeth 5 horizontally support the precision substrate at its side peripheral parts with their front medium thickness areas and rear medium thickness areas, with a high accuracy, so as to prevent occurrence of troubles due to precision substrates' vertically tipping over when they are put in and taken out by a dedicated robot.

Provided at both sides in the front and at the center in the rear on the bottom surface of container body 1 are positioning pieces that are positioned and mounted to processing equipment while a small bottom plate made of a thin plate is removably attached from the rear, at the rear part of the bottom surface of container body 1. Detachable identifiers that are fitted from below to this bottom plate are detected by processing equipment so that the storage container type, the number of precision substrates, etc. can be known.

A robotic flange 6 that is held by an automatic transporter called an OHT is detachably mounted at the center of the top of container body 1. Thick disk-shaped or U-shaped carriage handles are attached to the outer surfaces of both the side walls of container body 1 so that the storage container is transported by holding the paired carriage handles.

Positioning pieces, bottom plate, robotic flange 6 and carriage handles are formed of polycarbonate, polyether imide, polyether sulfone, polyether etherketone, cyclo-olefin resin or the like. These materials may be added with carbon black, acetylene black, carbon fibers, carbon nanotubes, metallic fibers, anti-static agents and the like, if necessary.

As shown in FIGS. 2 to 5, door element 10 includes a casing 11 that will be detachably fitted in a sealing manner to rim portion 2 of container body 1, a pair of covers 12 which cover both the left and right sides of the obverse side of the casing 11. Locking mechanisms 20 are arranged between casing 11 and a pair of covers 12. This door element 10 is formed of polycarbonate containing fluorine, polycarbonate, polyether sulfone, polyether imide, polyether etherketone, cyclo-olefin resin or the like into a laterally-long, approximately rectangular shape with its four corners rounded when viewed from the front. The material of door element 10 is imparted with conductivity as necessary.

A plurality of guides 13 of linear rail configurations opposing each other are formed on both the opposing surfaces of casing 11 and paired covers 12 (see FIGS. 2 to 5). First and second advancing and retracting plates 26 and 32 of locking mechanisms 20 are guided and moves along the guide surfaces of these plurality of guides 13. Casing 11 has a shallow, approximately dish-like section. Attached to the central part on the rear side of the casing and arranged top to bottom are elastic front retainers for holding precision substrates at their front peripheries by means of holding grooves.

An endless seal gasket 14 to be disposed between rim portion 2 of container body 1 and door element 10 is fitted along the peripheral wall of casing 11 in a compressible and deformable manner. Through-holes 15 that correspond to engaging recesses 3 of rim portion 2 are formed on both sides at the top and bottom of the peripheral wall (see FIGS. 4, 5 and 8).

As shown in FIGS. 6 through 12 each locking mechanism 20 includes: a rotary plate 21 that is rotatably supported by door element 10, a pair of first advancing and retracting plates 26 which each, as this rotary plate 21 rotates, linearly advance from a reference position inside door element 10 toward the peripheral wall of door element 10 when door element 10 is locked and linearly retract from the projected position to the reference position inside door element 10 when door element 10 is unlocked; second advancing and retracting plates 32 each of which is rotationally joined to and supported by the front end part of associated first advancing and retracting plate 26, and projects from the peripheral wall of door element 10 and fits into engaging recess 3 of container body 1 when door element 10 is locked and retracts and returns from engaging recess 3 of container body 1 into door element 10 when door element 10 is unlocked; pairs of guide ribs 37, each pair functioning to gradually incline the second advancing and retracting plate 32 in the thickness direction of door element 10 as the plate is projected when door element 10 is locked.

Each locking mechanism 20 is formed of polycarbonate, polybutylene terephthalate, polyether imide, polyether sulfone, polyether etherketone, polyphenylene sulfone, polyacetal resin or the like. These materials may he added with carbon black, acetylene black, carbon fibers, carbon nanotubes, metallic fibers, anti-static agents, talc and the like, if necessary.

Rotary plate 21 is formed with a cylindrical, actuated rib 23 in the center of a disk 22 and rotationally and axially supported on the obverse side of casing 11 at the middle, and is rotated by an actuating key of the door opening/closing device which is inserted through cover 12 into actuated rib 23 from without. Disk 22 of this rotary plate 21 has a pair of semi circular groove slots 24 formed in the circumferential direction. One end of each groove slot 24 is greatly curved toward the center of rotary plate 21.

A pair of arms 25 having an approximately J-shape are projectively formed from the outer peripheral surface of actuated rib 23. Each arm 25 engages a projection in cover 12 to thereby function to lock rotary plate 21 at a normal position (see FIG. 6).

Figure 9:
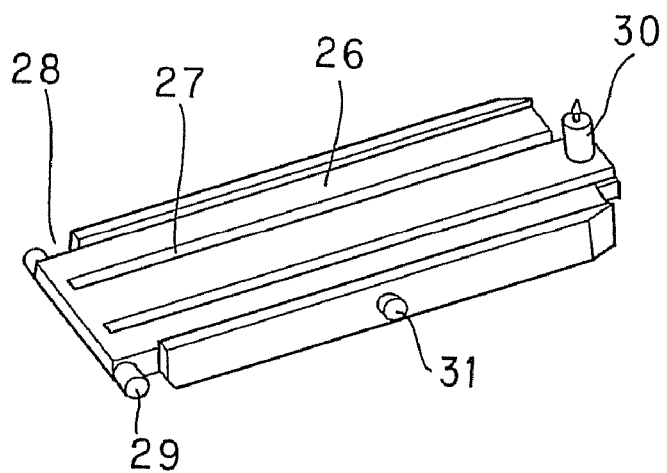
FIG. 9 is an illustrative perspective view showing a first advancing and retracting plate of a locking mechanism in an embodiment mode of a storage container according to the present invention.
Figure 10:
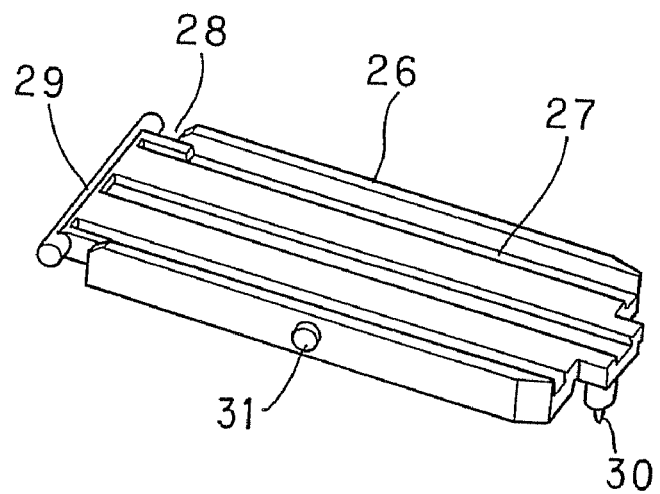
FIG. 10 is an illustrative perspective view showing the first advancing and retracting plate of FIG. 9, viewed from its rear side.

As shown in FIGS. 9 and 10, each first advancing and retracting plate 26 is essentially formed as a rectangular plate with indentations and projections 27 parallel-formed on both sides in order to enhance its strength. The plates are positioned on upper and lower sides of rotary plate 21 and between casing 11 and cover 12 so as to be linearly movable, guided by means of multiple guides 13. This first advancing and retracting plate 26 has a neck portion 28 at its front end part. Attached to this neck portion 28 is a coupling pin 29 to be coupled with second advancing and retracting plate 32. A cylindrical pin 30 which will fit into groove slot 24 of rotary plate 21 is formed upright at the center in the end part on the obverse side (see FIG. 7).

Figure 2:
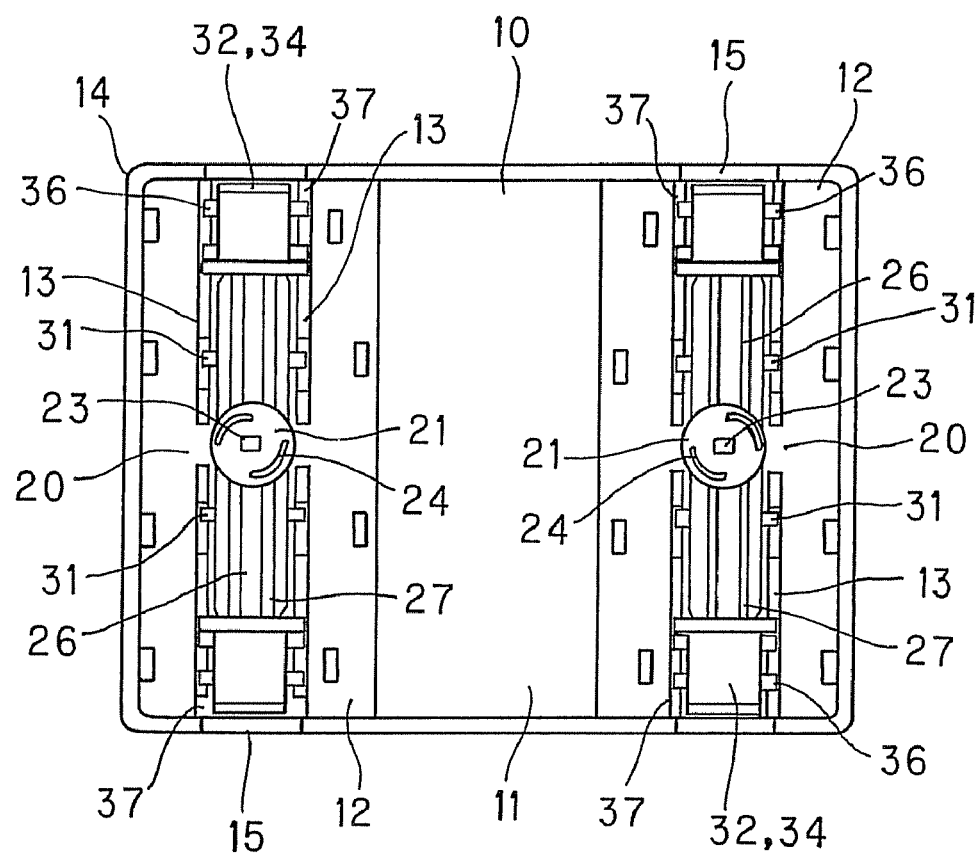
FIG. 2 is an illustrative front view showing a locking mechanism with a state in which a door element is unlocked in an embodiment mode of a storage container according to the present invention.
Figure 3:
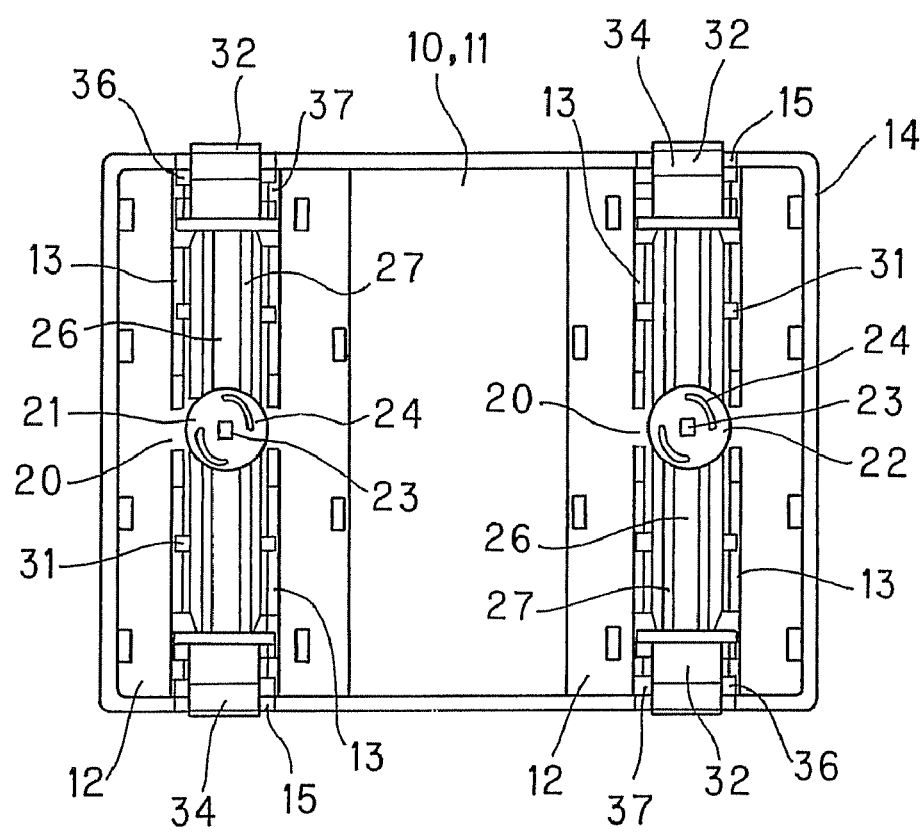
FIG. 3 is an illustrative front view showing a locking mechanism with a state in which a door element is locked in an embodiment mode of a storage container according to the present invention.
Figure 4:
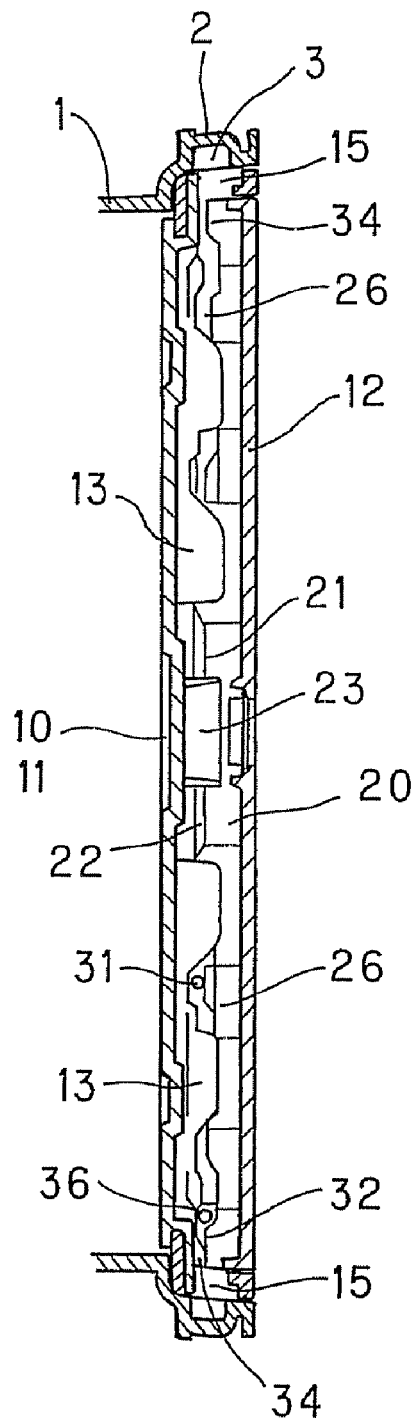
FIG. 4 is an illustrative sectional view showing a locking mechanism with its unlocked state in an embodiment mode of a storage container according to the present invention.
Figure 5:
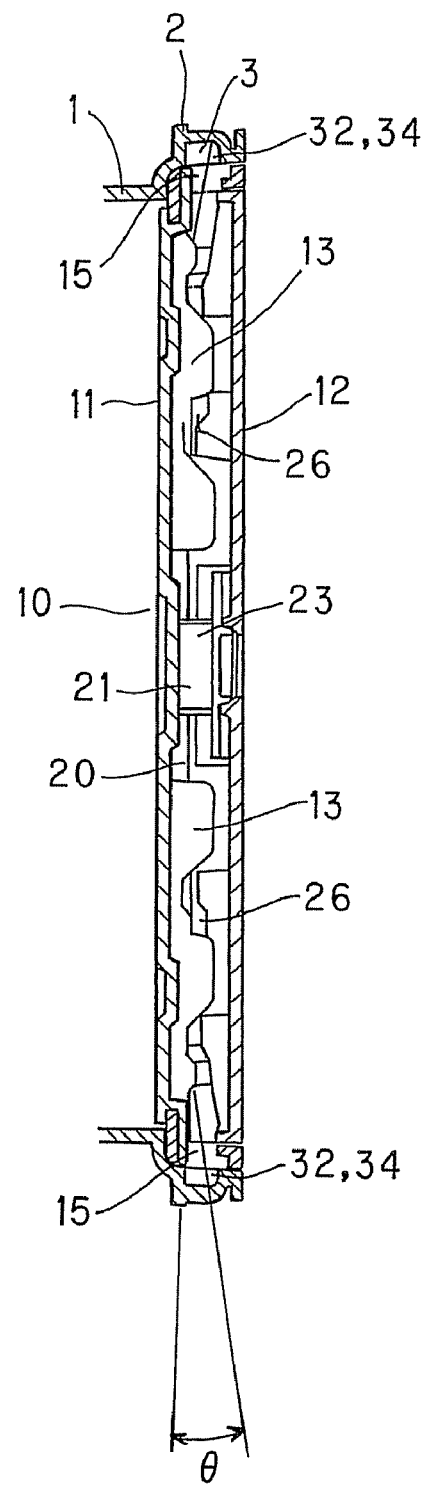
FIG. 5 is an illustrative sectional view showing a locking mechanism with its locked state in an embodiment mode of a storage container according to the present invention.
Figure 6:
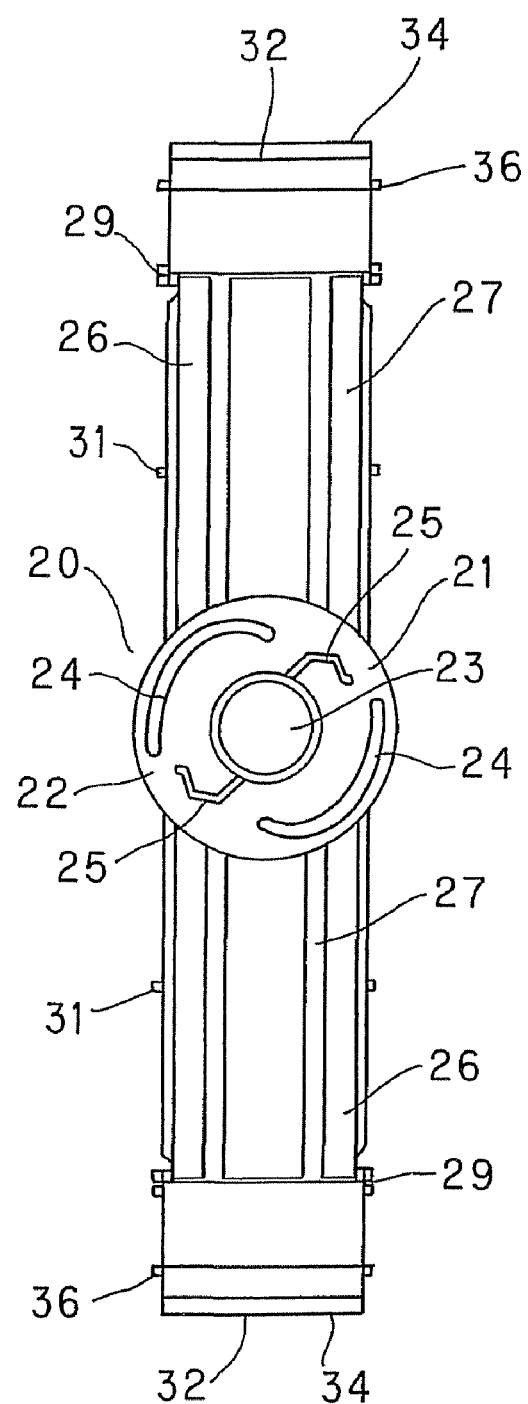
FIG. 6 is an illustrative front view showing a locking mechanism in an embodiment mode of a storage container according to the present invention.
Figure 7:
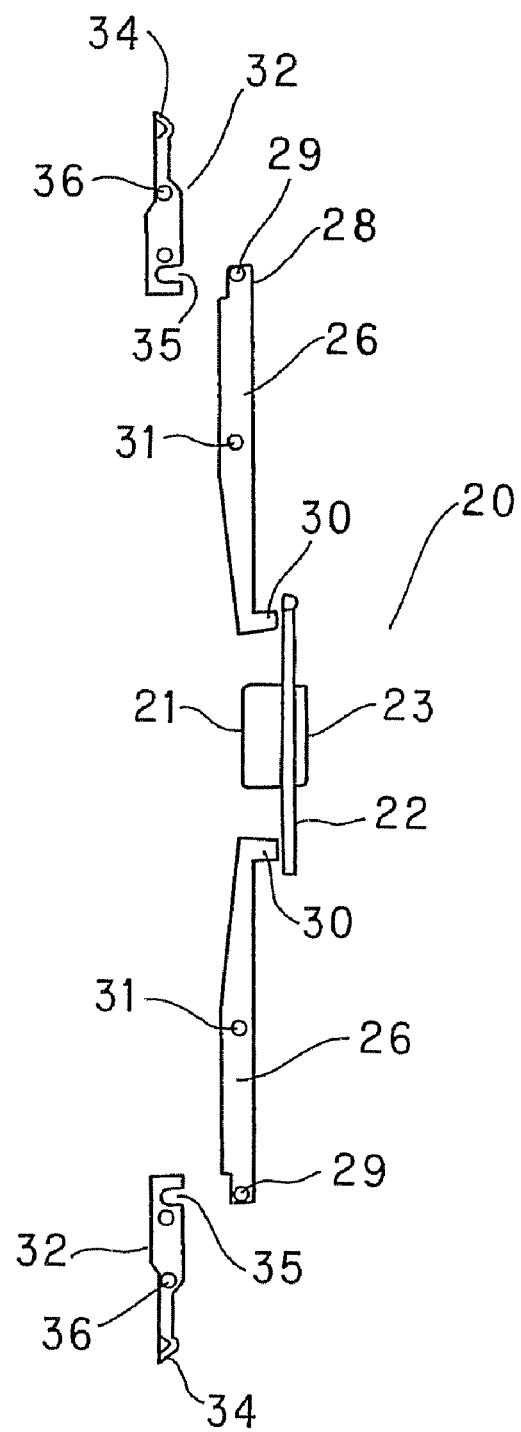
FIG. 7 is a deconstructed illustrative side view showing a locking mechanism in an embodiment mode of a storage container according to the present invention.
Figure 8:
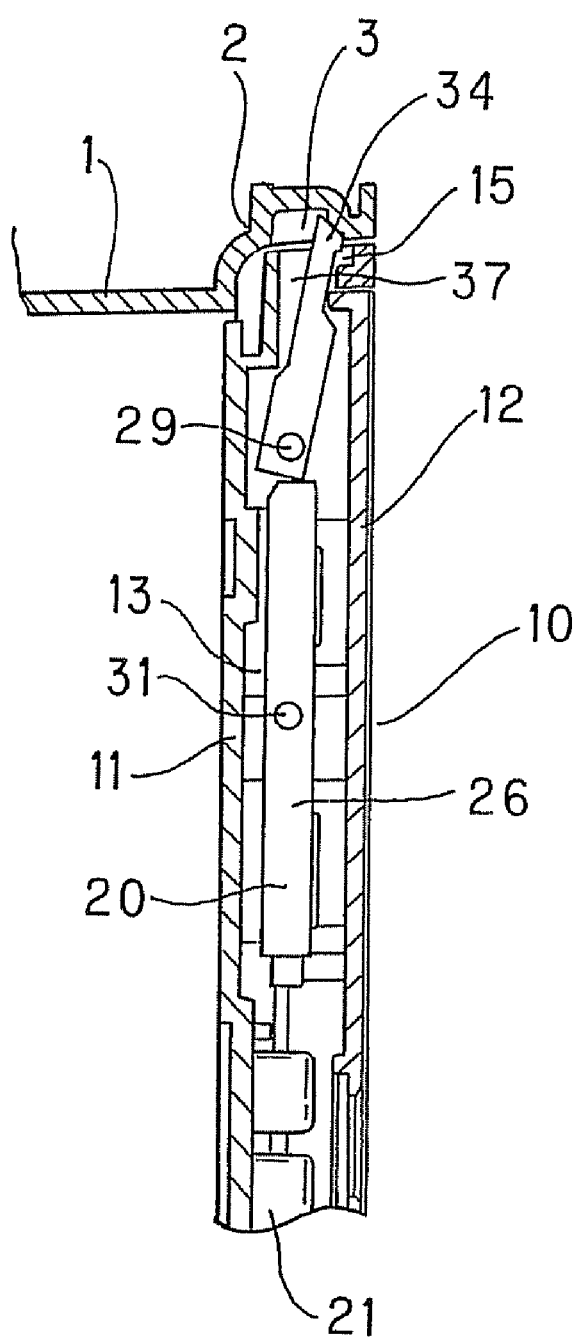
FIG. 8 is an illustrative sectional view schematically showing a locking mechanism with its locked state in an embodiment mode of a storage container according to the present invention.

First advancing and retracting plate 26 has cylindrical projections 31 projectively formed on both side parts thereof as shown in FIGS. 2 and 3 so that they can be slidably held between guides 13 and 13 of casing 11 and cover 12.

Figure 11:
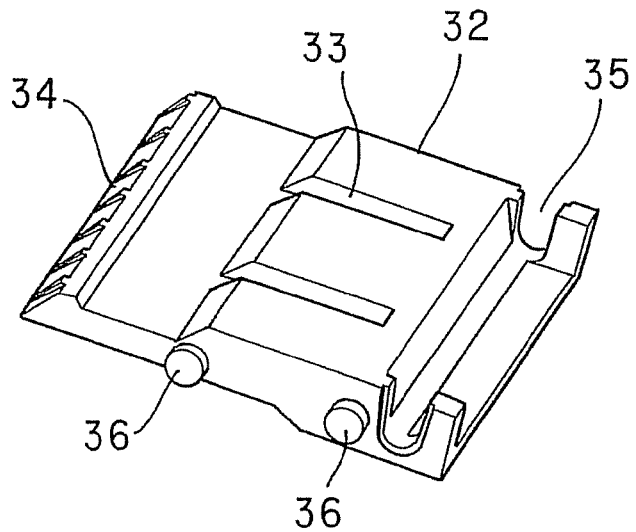
FIG. 11 is an illustrative perspective view showing a second advancing and retracting plate of a locking mechanism in an embodiment mode of a storage container according to the present invention.
Figure 12:
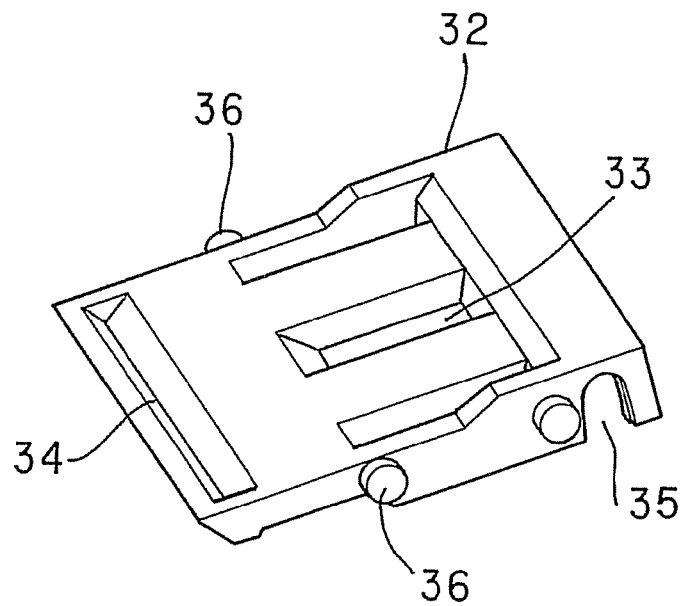
FIG. 12 is an illustrative perspective view showing the second advancing and retracting plate of FIG. 12, viewed from its rear side.

As shown in FIGS. 11 and 12, each second advancing and retracting plate 32 is essentially formed as a ribbed rectangular plate with indentations and projections 33 parallel-formed on both sides in order to enhance its strength. The plates are placed between casing 11 and cover 12 and guided by means of multiple guides 13 and guide ribs 37. This second advancing and retracting plate 32 has a tapering end formed as an engaging projection 34 having an approximately triangular section. This engaging projection 34, as it is being inclined, penetrates through through-hole 15 of door element 10, and is inserted into engaging recess 3 of container body 1.

Formed in the end part of second advancing and retracting plate 32 is a U-shaped grooved portion 35 which detachably receives and holds coupling pin 29 of first advancing and retracting plate 26. Second advancing and retracting plate 32 has cylindrical pin projections 36 projectively formed on both lateral sides thereof so that they can be slidably held between guides 13 of casing 11 and cover 12.

A plurality of guide ribs 37 are arranged in pairs at sides on the obverse side of casing 11, opposing each other and spaced accordingly, and located at both sides of second advancing and retracting plate 32 so as to be in contact with pin projections 36 and guide the plate in the top-and-bottom direction of door element 10. Each guide rib 37 is formed in a rectangular triangle form that gradually becomes narrow as it goes from the exterior to the interior of door element 10 so that its inclined surface in contact with pin projection 36 of second advancing and retracting plate 32 functions to incline projecting second advancing and retracting plate 32 an angle (θ) of 10 to 45 degrees, preferably 15 to 25 degrees, with respect to first advancing and retracting plate 26 or its direction of movement (see FIG. 5).

The reason for specifying the inclined angle of second advancing and retracting plate 32 within the range of 10 to 45 degrees is that there is a fear that if the inclined angle is smaller than 10 degrees, engaging projection 34 of second advancing and retracting plate 32 will move slidably relative to engaging recess 3 of container body 1 generating particulates. In contrast, if the inclined angle exceeds 45 degrees, the load required to move second advancing and retracting plate 32 becomes large, causing hindrance to the movement of second advancing and retracting plate 32.

In the above, when the open front of container body 1 is confined with door element 10, the door opening/closing device of the processing equipment fits and presses door element 10 against rim portion 2 of container body 1, then the door opening/closing device rotationally actuates rotary plate 21 of each locking mechanism 20 in the clockwise direction from without.

As rotary plates 21 turn clockwise, each first advancing and retracting plate 26, being guided by guides 13, linearly projects out in the top-and-bottom direction of door element 10. With this projecting of first advancing and retracting plate 26, each second advancing and retracting plate 32 projects forwards out from through-hole 15 of door element 10 as it is being guided by guides 13 and guide ribs 37 and inclined. At the same time, engaging projection 34 of each second advancing and retracting plate 32 inclines and moves into oblique contact with the front face of engaging recess 3 of container body 1. This inclined contact enables door element 10 to tightly seal and confine the front of container body 1 (see FIGS. 3, 5 and 8).

Upon this, instead of being formed with a simple plate-like shape, the front end part of second advancing and retracting plate 32 is formed with engaging projection 34 having an approximately triangular section which is reduced in area, so that its contact area with the front face of engaging recess 3 is reduced and it is possible to markedly efficiently eliminate the risk of particulates being generated.

In contrast to the above, when door element 10 is removed from the front of container body 1, the door opening/closing device rotationally actuates rotary plate 21 of each locking mechanism 20 in the counterclockwise direction from without.

As rotary plates 21 turn counterclockwise, each first advancing and retracting plate 26, being guided by guides 13, linearly retracts from the projected position to the original position. With this retraction of first advancing and retracting plate 26, each inclined, second advancing and retracting plate 32 retracts from engaging recess 3 of container body 1 into through-hole 15 of door element 10. As a result of this retraction, door element 10 is set to be removable from the front of container body 1 (see FIGS. 2 and 4). Then and thereafter, door element 10 is removed from the front of container body 1 by its being suctioned by the door opening/closing device.

According to the above configuration, if first advancing and retracting plate 26 moves linearly, second advancing and retracting plate 32 that is separated from the former fits and engages engaging recess 3 of container body 1 as it is being inclined, therefore there is no fear of particulates being generated due to rubbing between engaging recess 3 of container body 1 and second advancing and retracting plate 32. Further, since the advancing and retracting plate is divided into first and second advancing and retracting plates 26 and 32, if second advancing and retracting plate 32 is inclined steeply toward the cover there is no risk of causing interference with casing 11 and cover 12 of door element 10.

Moreover, since the advancing and retracting plate is divided into first and second advancing and retracting plates 26 and 32 so that the longitudinal dimensions of first and second advancing and retracting plates 26 and 32 are reduced, it is possible to enhance the flexural rigidity in the longitudinal direction. Particularly, for second advancing and retracting plate 32 on which the engaging force acts, the longitudinal dimension can be designated as much as one to three times of the lateral dimension, so that the flexural rigidity in the longitudinal direction can be markedly improved.

Accordingly, even with a small force (e.g., a force not greater than 40 N), it is possible to transfer the engaging force to second advancing and retracting plate 32 efficiently enough to achieve reliable sealing. Hence, it is no longer necessary to hold first and second advancing and retracting plates 26 and 32 with a strong supporting structure. In addition, it is possible to reduce the space of door element 10 and reduce its thickness. Further, since the advancing and retracting plate has an easily assembled configuration of individual first and second advancing and retracting plates 26 and 32, it is possible to easily replace only the parts that have been worn out or seriously damaged by continuous use, impacts or the like.

Further, since the advancing and retracting plate is assembled of a plurality of parts, the reaction force from door element 10 will not be directly transferred to rotary plate 21, hence it is possible to efficiently prevent rotary plate 21 from rotating freely and/or being damaged and still expect reliable self-returning. Also, since there is no need of forming specially shaped multiple cam facets in rotary plate 21 of locking mechanism 20, the configuration can be simplified.

Since it is not necessary to use any engagement shaft made of metal, there is no fear of the precision substrates accommodated in container body 1 from being contaminated due to metal elution. Moreover, since locking mechanism 20 can be operated by a smaller force than that in conventional configurations, there is no fear of the precision substrate failing to be taken out and being contaminated. Still more, since engaging projections 34 of multiple second advancing and retracting plates 32 are brought into contact with respective front faces of engaging recess 3 of container body 1 in an inclined manner to tightly seal container body 1, door element 10 is unlikely to deform or be tilted, and also seal gasket 14 can be deformed and brought into uniform contact with rim portion 2, hence it is possible to markedly improve sealing performance.

Though in the above embodiment mode the obverse side of casing 11 is covered with a pair of left and right covers 12, the configuration is not limited to this. For example, the obverse side of casing 11 may be covered by a single cover 12. Further, guides 13, arms 25, pin projections 31 and 36, coupling pins 29 may be modified, increased or reduced in number as appropriate as shown in FIGS. 1 through 12. A silicone resin and/or fluoro resin may be added to the material of rotary plates 21, paired first advancing and retracting plates 26, paired second advancing and retracting plates 32 and multiple guide ribs 37 of locking mechanism 20, so as to improve slidability.

Further, first and second advancing and retracting plates 26 and 32 may be formed in bar-like shapes or other shapes. Engaging projection 34 and guide ribs 37 of second advancing and retracting plate 32 may have a triangular section or may be formed in a trapezoidal shape or the like as long as the same operational effect can be obtained. Further, guide ribs 37 may be provided for cover 12 so that engaging projection 34 of second advancing and retracting plate 32 is adapted to be inclined and abut the rear face of engaging recess 3.

The invention claimed is:

1. A storage container comprising: a container body for accommodating articles; a door element for opening and closing the opening of the container body; and a locking mechanism for locking the door element that covers the opening of the container body, wherein the locking mechanism includes: a rotatable rotary element; a first advancing and retracting element which, in accordance with the rotation of the rotary element, projects toward the door element's periphery from a door element's reference position when the door element is locked and returns to the door element's reference position when the door element is unlocked; a second advancing and retracting element which is rotatably supported by the first advancing and retracting element, and projects out from the door element to be inserted into a recess in the inner periphery of the opening of the container body when the door element is locked and returns from the recess of the container body towards the door element when the door element is unlocked; and a guide element for inclining the second advancing and retracting element in the door element's direction of thickness when it is projecting, wherein a plurality of guides for guiding the first and second advancing and retracting elements to move along guide surfaces of the plurality of guides are formed on opposing surfaces of a casing and a cover of the door element, wherein the first advancing and retracting element includes a neck portion at its front end part and a coupling in attached to said neck portion, and wherein the second advancing and retracting element includes a U-shaped grooved portion formed in its front end part which detachably receives and holds the coupling pin of the first advancing and retracting element, and pin projections projectively formed on both lateral sides thereof so that they can be slidably held between the plurality of guides.

2. The storage container according to claim 1, wherein the door element is formed of the casing to be fitted to the opening of the container body and the cover that covers the casing, the rotary element, first advancing and retracting element and second advancing and retracting element are laid out between the casing and the cover, and the guide element of the locking mechanism is formed at least on one of the opposing surfaces of the casing and the cover.

3. The storage container according to claim 1, wherein the pin projections come into contact with the guide element, the guide element is formed to have a polygonal section, and the contact surface of the guide element that abuts the pin projections is inclined so that the second advancing and retracting element that is projecting is inclined at an angle ranging from 10 to 45 degrees with respect to the first advancing and retracting element.

4. The storage container according to claim 1, wherein the second advancing and retracting element in the locking mechanism is formed as an approximately flat plate, and the front end part of the second advancing and retracting element is formed in a shape that reduces the area of contact with the recess of the container body.

5. The storage container according to claim 2, wherein the pin projections come into contact with the guide element, the guide element is formed to have a polygonal section, and the contact surface of the guide element that abuts the pin projections is inclined so that the second advancing and retracting element that is projecting is inclined at an angle ranging from 10 to 45 degrees with respect to the first advancing and retracting element.

6. The storage container according to claim 2, wherein the second advancing and retracting element in the locking mechanism is formed as an approximately flat plate, and the front end part of the second advancing and retracting element is formed in a shape that reduces the area of contact with the recess of the container body.

7. The storage container according to claim 3, wherein the second advancing and retracting element in the locking mechanism is formed as an approximately flat plate, and the front end part of the second advancing and retracting element is formed in a shape that reduces the area of contact with the recess of the container body.

8. The storage container according to claim 5, wherein the second advancing and retracting element in the locking mechanism is formed as an approximately flat plate, and the front end part of the second advancing and retracting element is formed in a shape that reduces the area of contact with the recess of the container body.

* * * * *